United States Patent [19]

Greiff

[11] Patent Number: 5,144,184
[45] Date of Patent: Sep. 1, 1992

[54] MICROMECHANICAL DEVICE WITH A TRIMMABLE RESONANT FREQUENCY STRUCTURE AND METHOD OF TRIMMING SAME

[75] Inventor: Paul Greiff, Wayland, Mass.

[73] Assignee: The Charles Stark Draper Laboratory, Inc., Cambridge, Mass.

[21] Appl. No.: 470,938

[22] Filed: Jan. 26, 1990

[51] Int. Cl.[5] .............................................. H01L 41/08
[52] U.S. Cl. ..................................... 310/312; 310/321; 310/323; 310/367
[58] Field of Search .................. 310/25, 312, 321, 323, 310/367, 389

[56] References Cited

U.S. PATENT DOCUMENTS

| | | | |
|---|---|---|---|
| 3,913,035 | 10/1975 | Havens | 331/107 |
| 4,044,305 | 8/1977 | Oberbeck | 324/154 R |
| 4,234,666 | 11/1980 | Gursky | 428/573 |
| 4,321,500 | 3/1982 | Paros et al. | 310/321 |
| 4,447,753 | 5/1984 | Ochiai | 310/312 |
| 4,468,584 | 8/1984 | Nakamura et al. | 310/370 |
| 4,478,076 | 10/1984 | Bohrer | 73/204 |
| 4,478,077 | 10/1984 | Bohrer et al. | 73/204 |
| 4,483,194 | 11/1984 | Rudolf | 73/517 R |
| 4,484,382 | 11/1984 | Kawashima | 310/312 X |
| 4,490,772 | 12/1984 | Blickstein | 361/281 |
| 4,495,499 | 1/1985 | Richardson | 343/5 |
| 4,502,042 | 2/1985 | Wuhrl et al. | 340/568 |
| 4,598,585 | 7/1986 | Boxenhorn | 73/505 |
| 4,600,934 | 7/1986 | Aine et al. | 357/26 |
| 4,619,001 | 10/1986 | Kane | 455/192 |
| 4,628,283 | 12/1986 | Reynolds | 331/68 |
| 4,639,690 | 1/1987 | Lewis | 331/96 |
| 4,651,564 | 3/1987 | Johnson et al. | 73/204 |
| 4,699,006 | 10/1987 | Boxenhorn | 73/517 AV |
| 4,743,789 | 5/1988 | Puskas | 310/316 |
| 4,789,803 | 12/1988 | Jacobsen et al. | 310/309 |
| 4,805,456 | 2/1989 | Howe et al. | 73/517 AV |
| 4,808,948 | 2/1989 | Patel et al. | 331/4 |
| 4,851,080 | 7/1989 | Howe et al. | 156/647 |
| 4,882,933 | 11/1989 | Petersen et al. | 73/517 R |
| 4,900,971 | 2/1990 | Kawashima | 310/367 X |
| 4,916,520 | 4/1990 | Kurashima | 357/71 |
| 5,001,383 | 3/1991 | Kawashima | 310/367 |
| 5,016,072 | 5/1991 | Greiff | 357/26 |

FOREIGN PATENT DOCUMENTS

| | | | |
|---|---|---|---|
| 0121728 | 9/1980 | Japan | 310/367 |
| 0136125 | 8/1983 | Japan | 310/367 |
| 0037722 | 3/1984 | Japan | 310/367 |

OTHER PUBLICATIONS

M. Nakamura et al., "Novel Electromechanical Micro-Machining and Its Application for Semiconductor Acceleration Sensor IC," *Digest of Technical Papers* (1987), Institute of Electrical Engineers of Japan, pp. 112-115.

Primary Examiner—Mark O. Budd
Attorney, Agent, or Firm—Weingarten, Schurgin, Gagnebin & Hayes

[57] ABSTRACT

A micromechanical device having a frequency trimmable, resonant structure, including a semiconductor substrate forming a support frame. First and second flexures flexibly couple and support a structure within the support frame, to permit rotation with a resonant frequency about a first axis which passes through the flexures. First and second elongated openings located proximate the first and second flexures form first and second tension relief beams adjacent the flexures, for providing stress relief of the tensile forces between the resonant structure and the flexures, and for establishing and trimming the resonant frequency of the resonant structure. The resonant structure may also include first and second regions located proximate the elongated openings, the regions having a thickness which is substantially less than the thickness of the remainder of the resonant structure, to permit removal of at least a portion of the regions thereby enlarging the elongated openings and further trimming the resonant frequency of the resonant structure. Also disclosed is a method of trimming the resonant frequency of such a micromechanical device.

12 Claims, 3 Drawing Sheets

MICROMECHANICAL DEVICE WITH A TRIMMABLE RESONANT FREQUENCY STRUCTURE AND METHOD OF TRIMMING SAME

FIELD OF THE INVENTION

This invention relates to micromechanical devices having resonant structures and more particularly, to a method of fabricating such a device to facilitate trimming the resonant frequency of the resonant structure.

BACKGROUND OF THE INVENTION

Methods of fabricating micromechanical devices from semiconductor materials such as silicon are well known. One such method is described in Applicant's commonly assigned pending U.S. Pat. application Ser. No. 143,515 entitled: "Method and Apparatus for Semiconductor Chip Transducer" and incorporated herein by reference.

As disclosed in the above-referenced pending application, diffusion of a silicon substrate with selective etch resistant P-type boron dopant is utilized to form both a vibrationally supported planar element or similar resonant structure, as well as "flexures" or "bridges" supporting such structures to an adjacent frame, for vibration at a resonant frequency.

The Boron diffusion used to define the flexures and the subsequent etching of the surrounding silicon, however, causes shrinking that creates a high tensile forces or stress in and around the flexures. Such stress can be substantial and may be the cause of structural failure in the micromechanical device. Additionally, the high tensile force increases the resonant frequency of the structure, requires a higher drive voltage and induces of cross coupling to other adjacent structures or elements.

To date, attempts at reducing these tensile forces have included providing a tension relief beam within the resonant structure, and to which the flexures are attached. These tension relief beams are allowed to deflect, providing the necessary tension relief for the flexures and the resonant structure. Reducing the tensile forces in the resonant structure also achieves the result of lowering the resonant frequency of the structure. Accordingly, calculations must be made to arrive at an approximate length and width of the tension relief beams which will produce a resonant structure having approximately the desired resonant frequency. However, since many random fabrication variables may be involved, the selection of the tension relief beam length and width results in a mere coarse definition of the resonant frequency, and may not provide the degree of accuracy in the resonant frequency required for a particular design.

SUMMARY OF THE INVENTION

According to the present invention, a micromechanical device is provided in which the resonant frequency of a structure within the device is adapted to be trimmed to establish the desired resonant frequency. In accordance with the teaching of the present invention, such a micromechanical device includes a first support frame formed from a semiconductor substrate. A resonant structure is disposed within the support frame, the support frame and the resonant structure having at least one co-planar surface. First and second flexures flexibly couple and support the resonant structure within the support frame to permit rotation of the resonant structure about a first axis which passes through the flexures. Additionally, the invention provides first and second elongated openings located proximate the first and second flexures and forming first and second tension relief beams to which the first and second flexures are attached. The tension relief beams provide stress relief of the tensile forces between the resonant structure and support frame through the flexures thereby defining the resonant frequency of the resonant structure.

Further included may be third and forth orthogonally directed flexures flexibly coupling and supporting the first support frame within a second support frame, thereby permitting the first support frame to rotate about a second axis substantially perpendicular or orthogonal to the first axis.

In a preferred embodiment, the resonant structure includes first and second regions located proximate the first and second elongated openings, and having a thickness which is substantially less than the thickness of the remainder of the resonant frequency structure, to permit removal of at least a portion of the first and second region by a trimming instrument, thereby enlarging the elongated opening to alter the resonant frequency of the resonant frequency structure. Additionally, the first and second regions of reduced thickness may also include selectively spaced areas such as ribs having substantially the same thickness as the remainder of the resonant structure.

A method of trimming such a resonant structure contained in a micromechanical device utilizes a high energy radiation source such as a laser, to remove at least a portion of the first and second areas of reduced thickness or other portions of the resonant structure, thereby enlarging the elongated opening to alter the resonant frequency of the resonant structure, typically reducing it to the desired frequency.

DESCRIPTION OF THE DRAWINGS

These and other features and advantages of the present invention are described below in the following description and the accompanying drawings in which.

DETAILED DESCRIPTION OF THE INVENTION

Figure 1:
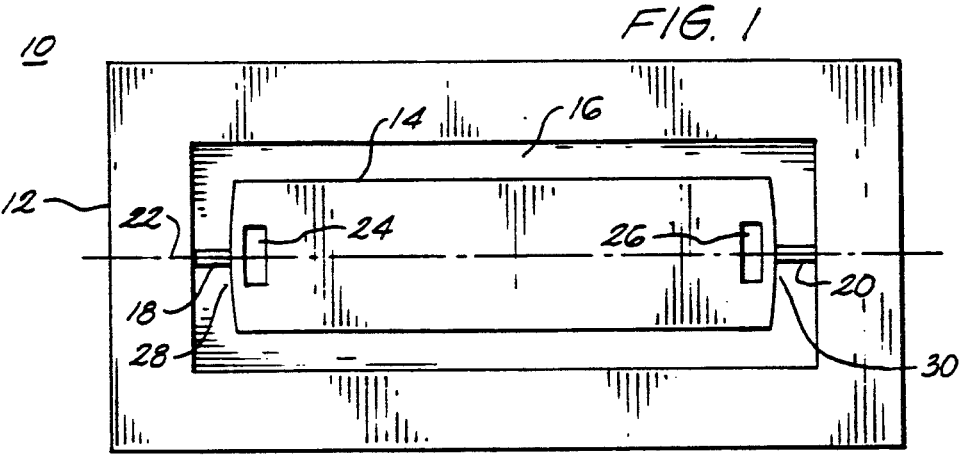
FIG. 1 is a top view of a micromechanical device employing the tension relief beam according to the present invention.

A micromechanical device having a trimmable, resonant structure according to this invention includes micromechanical device 10, FIG. 1, comprising support frame 12 which may be fashioned from a semiconductor material such as silicon. A resonant structure 14 is disposed within a cavity 16 by flexures 18 and 20 which have been etched from support frame 12 utilizing conventional etching techniques described in greater detail in applicant's pending U.S. Pat. application Ser. No. 143,515. Selective doping of silicon frame 12, resonant structure 14 and flexures 18 and 20 with boron and subsequent etching of the substrate creates cavity 16 and flexures 18 and 20 which support resonant structure 14. Doping, etching and undercutting of resonant structure 14 promotes a large tensile force to exist in resonant structure 14 and flexures 18 and 20 due to the lattice mismatch between boron doped areas and the parent silicon wafer. Flexures 18 and 20 allow resonant structure 14 to rotate or vibrate at a resonant frequency about an axis 22 which passes through the flexures.

Located adjacent flexures 18 and 20 are elongated openings 24 and 26 which form tension relief beams 28 and 30 respectively separating the flexures from the rest of the resonant structure.

Figure 2:
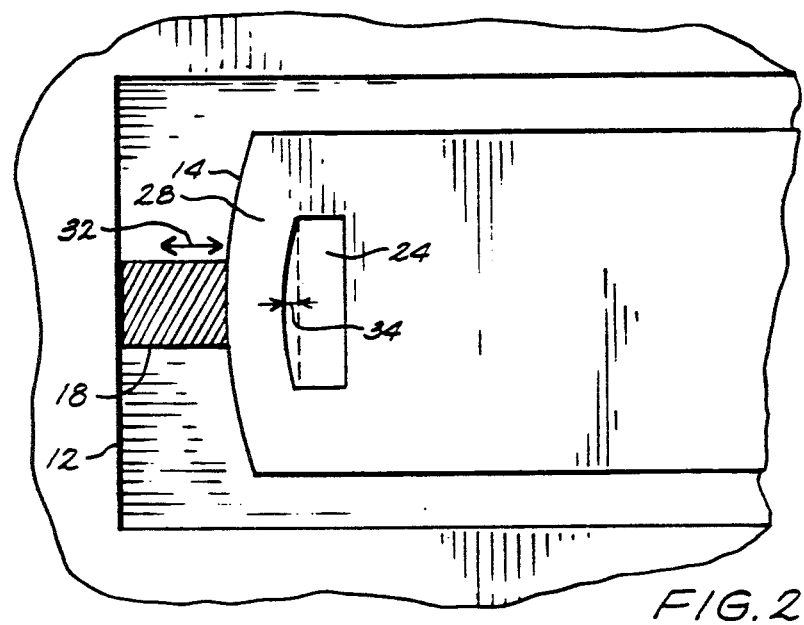
FIG. 2 is an enlargement of the area surrounding the tension relief beam of FIG. 1 showing the effect of the tensile forces on the tension relief beam.

As shown in greater detail in FIG. 2, tension relief beam 28 formed by elongated opening 24 is attached to flexure 18. Tensile forces between resonant structure 14 and frame 12 in the direction of arrow 32 cause tension relief beam 28 to be deflected or bowed a distance shown by arrow 34. Deflection of tension relief beam 28 reduces the tension between resonant structure 14 and frame 12 to a small portion, approximately 0.1% to 1%, of the yield strength, which is an acceptable number and in so doing, serves to lower the resonant frequency of resonant structure 14 by reducing the torsional stiffness of flexures 18 and 20.

Although the length and width of elongated opening 24 may be preselected to provide a predetermined amount of tension relief and accordingly, a predetermined resonant frequency to resonant frequency structure 14, variations in manufacturing processes do not allow the resonant frequency to be preselected with the accuracy required for some applications. Accordingly, it is an advantage of the present invention to provide a resonant structure whose resonant frequency may be tuned or adjusted after the device has been fabricated, packaged and tested.

Figure 3:
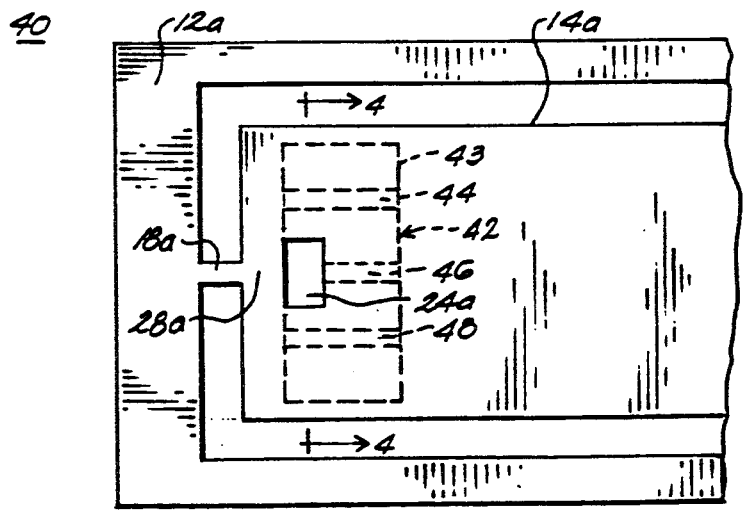
FIG. 3 is a schematic representation of the tension relief beam and beam expansion area according to the present invention.

Such a micromechanical device 40, FIG. 3, includes resonant structure 14a flexibly coupled to support frame 12a by means of flexure 18a. Elongated opening 24a creates tension relief beam 28a. Adjacent elongated opening 24a is disposed region 42 enclosed by dashed line 43, which has a thickness less than the thickness of resonant structure 14a. In addition, ribs 44, 46 and 48 may be provided which have the same thickness as resonant structure 14a, and provide additional strength to resonant structure 14a in the area surrounding opening 24a.

Figure 4:
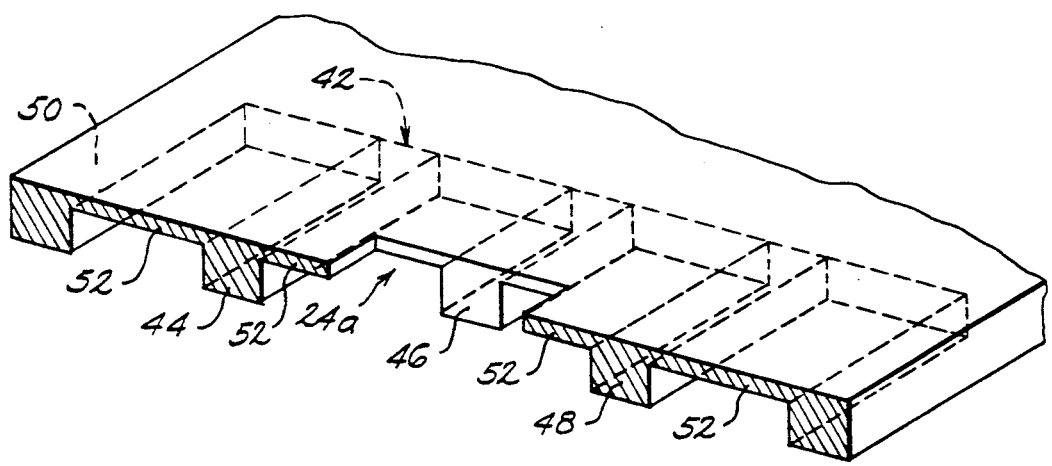
FIG. 4 is a cross sectional view of the tension relief beam and beam extension area of FIG. 3.

Typically, region 42, FIG. 4, is thinner than the remainder of resonant structure 14a. For example, the area of resonant structure 14a indicated at 50 has a thickness of approximately 3.0 microns, whereas area 52 of region 42 has a thickness of approximately 0.3 microns. Support ribs 44, 46 and 48 have approximately the same thickness as resonant structure 14a, or 3 microns. Providing an area of reduced thickness 52 facilitates enlargement of elongated opening 24a thereby facilitating trimming of the resonant frequency of resonant structure 14a after the micromechanical device has been fabricated.

Figure 5:
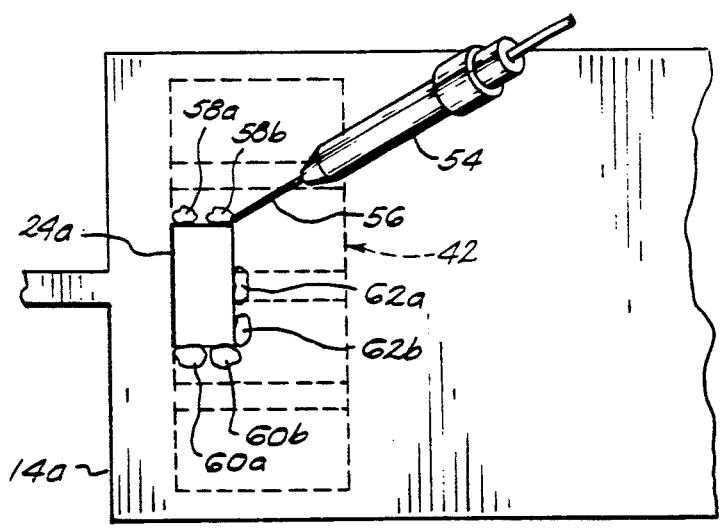
FIG. 5 is a top view of the expanded tension relief beam of FIG. 3 formed by use of a trimming instrument such as a laser.

Trimming the resonant frequency may be performed, for example, by utilizing a source of high intensity radiant energy 56, FIG. 5, from a device such as a lasingtip 54. Utilizing such a device, areas 58a and 58b as well as areas 60a and 60b may be removed from region 42 such as by ablation, to enlarge elongated opening 24a thereby lowering the resonant frequency of resonant structure 14a. In addition, areas 62a and 62b may also be removed from region 42 although removing portions 62a and 62b of region 42 will have a much smaller effect on the adjustment of the resonant frequency of the structure in comparison to removing portions of region 42 as shown at 58a, 58b and 60a, 60b.

Figure 6:
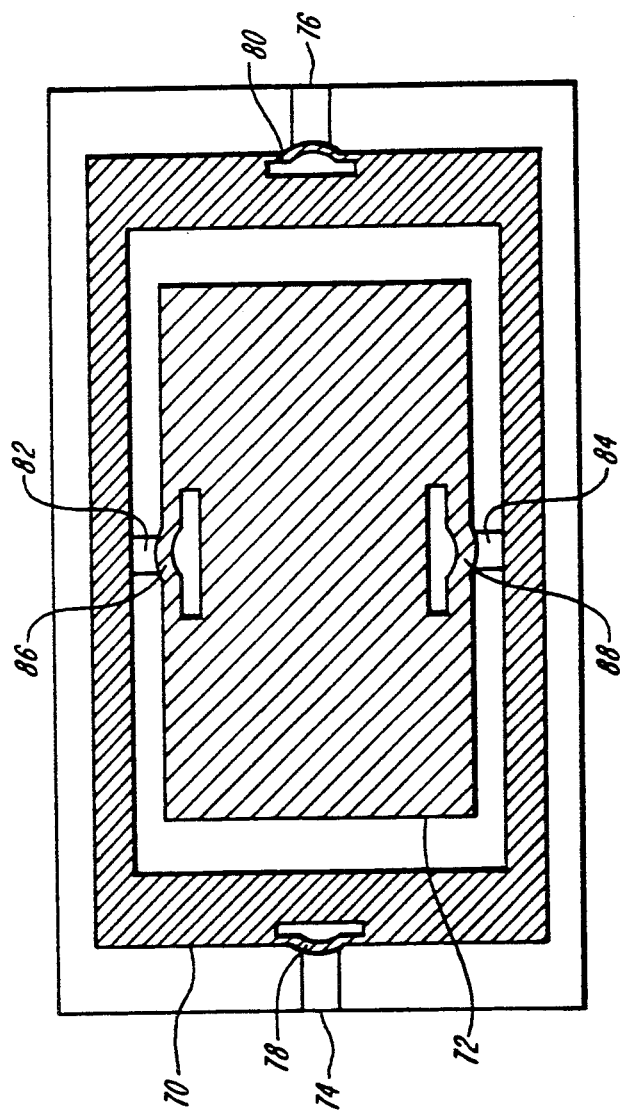
FIG. 6 is a plan view of a micromechanical device according to the present invention including a second resonant structure supported by third and forth orthogonally directed flexures.

An additional embodiment of the present invention is shown in FIG. 6 and includes first and second resonant structures 70,72, respectively. The first resonant structure 70 is supported by flexible elements 74,76. The flexible elements are coupled, at one end, to tension relief beams 78 and 80. The second resonant structure 72 is supported by third and forth flexible elements 82 and 84 arranged orthogonal to the first and second flexible elements. One end of each of the third and fourth flexible elements it also coupled to third and fourth tension relief beams 86 and 88.

Although specific features of the invention are shown in some drawings and not in others, this is for convenience only as each feature may be combined with any or all of the other features in accordance with the invention. Other embodiments and are within the following claims.

What is claimed is:

1. A micromechanical device having a trimmable, resonant structure comprising:

a semiconductor substrate including a first support frame;

a resonant structure disposed within said support frame;

first and second flexible elements proximate opposing edges of said resonant structure, said first and second flexible elements flexibly coupling and supporting said resonant structure within said support frame, to permit rotation of said resonant structure about a first axis which passes through said flexible elements; and means for establishing a trimmable resonant frequency for said resonant structure, including first and second elongated openings proximate a first end of said first and second flexible elements, said elongated openings forming first and second tension relief beams adjacent said first and second flexible elements and to which said first and second flexible elements are attached, said tension relief beams having a predetermined length and flexible in a direction parallel to said axis which passes through said flexible elements, for deflecting a first distance along said axis under longitudinal tension from said flexible elements, for providing stress relief of longitudinal tensile forces between said resonant structure and said flexible elements, thereby establishing a trimmable resonant frequency for said resonant structure.

2. The device of claim 1 in which said first and second elongated openings are located in said resonant structure adjacent said first and second flexible elements.

3. The device of claim 1 further including third and fourth flexible elements, flexibly coupling and supporting said first support frame within a second support frame, to permit said first support frame to rotate about a second axis substantially perpendicular to said first axis.

4. The device of claim 1 wherein said openings are formed partly by etching and partly by ablation.

5. The device of claim 1 further including a region of said resonant structure, adjacent said opening, having a reduced thickness.

6. A micromechanical device having at least one trimmable resonant frequency structure comprising:
- a semiconductor substrate including a first support frame;
- a resonant structure disposed within said support frame, said support frame and said resonant structure having at least one coplanar surface;
- first and second flexible elements co-planar with and proximate opposing edges of said resonant structure, said first and second flexible elements flexibly coupling and supporting said resonant structure within said support frame, to permit rotation of said resonant structure about a first axis which passes through said flexible elements; and
- means for establishing a trimmable resonant frequency for said resonant structure including first and second elongated openings having a predetermined length and width disposed within said resonant structure proximate a first end of said first and second flexible elements, said elongated openings forming first and second tension relief beams adjacent said first and second flexible elements and to which said first and second flexible elements are attached, said tension relief beams flexible in a direction parallel to said axis which passes through said flexible elements, for deflecting a first distance along said axis under longitudinal tension from said flexible elements, for providing stress relief of longitudinal tensile forces between said resonant structure and said flexible elements, thereby establishing a trimmable resonant frequency for said resonant structure.

7. The device of claim 6 in which said means for establishing a trimmable resonant frequency includes first and second regions adjacent said first and second openings facilitating removal of resonant structure material, for increasing said predetermined length and width of said elongated opening.

8. The device of claim 7 wherein said first and second regions have a thickness which is less than the thickness of the remainder of said resonant frequency structure, to permit removal of at least a portion of said first and second regions by a trimming instrument, for enlarging said first and second elongated openings and trimming the frequency of said resonant structure.

9. The device of claim 8 in which said trimming instrument includes a laser.

10. The device of claim 8 in which said first and second regions include selectively spaced areas having substantially the same thickness as said resonant structure.

11. A micromechanical device having a trimmable resonant structure comprising:
- a semiconductor substrate including a first support frame;
- a resonant frequency structure disposed within said support frame, said support frame and said resonant structure having at least one co-planar surface;
- first and second flexible elements co-planar with and proximate opposing edges of said resonant structure, flexibly coupling and supporting said resonant structure within said support frame, to permit rotation of said resonant structure about a first axis which passes through said first and second flexible elements;
- means for establishing a resonant frequency for said resonant structure including first and second elongated openings having a predetermined length and width, disposed within said resonant structure proximate said first and second flexible elements, and forming first and second tension relief beams, for providing stress relief of tensile forces between said resonant structure and said flexible elements; and
- means, adapted for trimming the resonant frequency of said resonant structure, including means for increasing at least one of said predetermined length and width of at least one of said first and second elongated openings, said means for increasing including first and second regions of said resonant frequency structure proximate said first and second elongated openings, said first and second regions having a thickness which is less than the thickness of the remainder of said resonant structure, to permit removal of at least a portion of at least one of said first and second regions, thereby enlarging said first and second elongated openings and trimming the resonant frequency of said resonant structure.

12. The micromechanical device of claim 1 wherein said means for establishing a trimmable resonant frequency further includes at least first and second regions of removable semiconductor material adjacent said first and second elongated openings respectively, for permitting removal of at least a portion of one of said first and second regions of removable semiconductor material by a trimming instrument, for enlarging at least one of said first and second openings and increasing said predetermined length of one of said first and second tension relief beams, for increasing said first distance of deflection of one of said first and second tension relief beams, thereby trimming the frequency of said resonant structure.

* * * * *